United States Patent
Sakai et al.

(10) Patent No.: US 10,317,242 B2
(45) Date of Patent: Jun. 11, 2019

(54) SENSOR DEVICE AND VEHICLE COLLISION DETECTION APPARATUS

(71) Applicant: DENSO CORPORATION, Kariya, Aichi-pref. (JP)

(72) Inventors: Makoto Sakai, Kariya (JP); Tsuyoshi Uezono, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 34 days.

(21) Appl. No.: 15/514,191

(22) PCT Filed: Sep. 8, 2015

(86) PCT No.: PCT/JP2015/004561
§ 371 (c)(1),
(2) Date: Mar. 24, 2017

(87) PCT Pub. No.: WO2016/051679
PCT Pub. Date: Apr. 7, 2016

(65) Prior Publication Data
US 2017/0299405 A1    Oct. 19, 2017

(30) Foreign Application Priority Data

Sep. 29, 2014 (JP) ................. 2014-198508

(51) Int. Cl.
*G01D 3/028* (2006.01)
*H04L 25/02* (2006.01)
(Continued)

(52) U.S. Cl.
CPC ............ *G01D 3/028* (2013.01); *G01L 5/0052* (2013.01); *G01P 1/023* (2013.01); *G01P 15/001* (2013.01); *H04L 25/02* (2013.01); *H04L 25/0272* (2013.01); *H04L 25/08* (2013.01); *H05K 9/0047* (2013.01); *H05K 9/0081* (2013.01);
(Continued)

(58) Field of Classification Search
CPC .... G01D 3/028; G01P 15/001; H05K 9/0081; G01L 5/0052; G08G 1/16
See application file for complete search history.

(56) References Cited

U.S. PATENT DOCUMENTS

2007/0262788 A1\* 11/2007 Sanji ................. H04B 3/50
326/30
2010/0157558 A1\* 6/2010 Inamoto ............. H05K 1/0228
361/777
2010/0223995 A1   9/2010 Watanabe

FOREIGN PATENT DOCUMENTS

JP    H07-221678    8/1995

\* cited by examiner

*Primary Examiner* — Xin Y Zhong
(74) *Attorney, Agent, or Firm* — Knobbe, Martens, Olson & Bear, LLP

(57) ABSTRACT

A sensor device includes: a detection device that detects a predetermined physical quantity and converts the physical quantity into a detection signal; a communication device that is to be connected to a controller through a first line and a second line, performs at least one of reception from the controller or transmission to the controller by a differential transmission method and, based on a request signal received from the controller, transmits the detection signal generated by the detection device; and a conductive shield member that is applied with a constant potential and covers the detection device and the communication device. The conductive shield member reduces radiation noise generation and simplifies the sensor device structure.

5 Claims, 5 Drawing Sheets

(51) Int. Cl.
*H04L 25/08* (2006.01)
*G01L 5/00* (2006.01)
*G01P 15/00* (2006.01)
*H05K 9/00* (2006.01)
*G01P 1/02* (2006.01)
*G08G 1/16* (2006.01)

(52) U.S. Cl.
CPC ............... *G08G 1/16* (2013.01); *G08G 1/165* (2013.01); *G08G 1/166* (2013.01)

FRONT ← → REAR

SENSOR DEVICE AND VEHICLE COLLISION DETECTION APPARATUS

CROSS REFERENCE TO RELATED APPLICATION

This application is based on Japanese Patent Application No. 2014-198508 filed on Sep. 29, 2014, the disclosure of which is incorporated herein by reference.

TECHNICAL FIELD

The present disclosure relates to a sensor device that exchanges information with a controller and a vehicle collision detection apparatus using the sensor device.

BACKGROUND ART

There has been technology relating to a sensor device which detects a predetermined physical quantity based on an instruction from a controller and transmits the detected value to the controller (refer to Patent Literature 1, for example). Such a sensor device communicates with a controller using digital signals, so that noise is generated due to signal changes. Radiation noise generated when a signal repeatedly changes its level between H (high) and L (low) adversely affects audio equipment and control devices used in surrounding areas.

A differential transmission method has been known as a method of high-speed transmission between a controller and a sensor device. In the differential transmission method, a transmission side and a reception side are connected by a pair of communication lines and information is transmitted between the two sides based on signal differences between the two communication lines. In the differential transmission method, when subjected to noise, the signals on the two communication lines are similarly affected, so that the contents of information being transmitted is not easily affected. This improves noise resistance (resistance to noise) of the communication. Regarding noise radiation from the communication lines, the controller and the sensor device are connected by a twisted pair cable, so that signal variations become symmetrical in the pair of cables. Hence, variations in magnetic flux caused by signal variations are canceled in the pair of cables and radiation noise generation is suppressed.

Noise generation from the sensor device itself, however, cannot be suppressed in the same manner as for the communication lines. Namely, in the sensor device, it is difficult to make circuit patterns symmetrical, so that suppression of radiation noise is difficult.

In this regard, according to the above-described existing technology, a plurality of circuit substrates are laminated through insulation layers, and the area of a conductive pattern on the H-level side of one of the circuit substrates is approximately equal to the total area over flat surfaces of a pair of circuit elements. In this way, charge variations due to voltage signal variations in a sensor device are reduced, and, radiation noise from the sensor device is reduced.

A radiation noise reduction method has also been known in which, in a sensor device using a printed circuit board, one of a plurality of circuit patterns is made as a ground pattern.

PRIOR ART LITERATURE

Patent Literature

Patent Literature 1: JP 4605484 B2

SUMMARY OF INVENTION

As described above, according to a sensor device using existing technology, the radiation of noise due to voltage signal variations from the sensor device can be reduced. This requires the use of a multi-layered circuit board and makes the sensor device larger and heavier. In addition, the sensor device structure becomes more complicated, so that the manufacturing cost increases.

An object of the present disclosure is to provide a sensor device which is capable of reducing radiation noise generation with a simple structure, and a vehicle collision detection apparatus using the sensor device.

According to a first embodiment of the present disclosure, a sensor device includes: a detection device that detects a predetermined physical quantity and converts the physical quantity into a detection signal; a communication device that is connected to a controller by a first line and a second line, performs at least one of reception from the controller or transmission to the controller by a differential transmission method and, based on a request signal received from the controller, transmits the detection signal generated by the detection device; and a conductive shield member applied with a constant potential and covering the detection device and the communication device.

According to the above structure, the sensor device includes the conductive shield member covering the detection device and the communication device, and the conductive shield member is applied with a constant potential. Even when signal voltages vary on the first line and the second line during differential transmission, the potential of the conductive shield member is kept constant, so that outward noise radiation from inside the conductive shield member can be suppressed.

BRIEF DESCRIPTION OF DRAWINGS

The above and other objects, features and advantages of the present disclosure will become more apparent from the following detailed description made with reference to the accompanying drawings, in which like parts are designated by like reference numbers and in which.

DESCRIPTION OF EMBODIMENTS

First Embodiment

Figure 1:
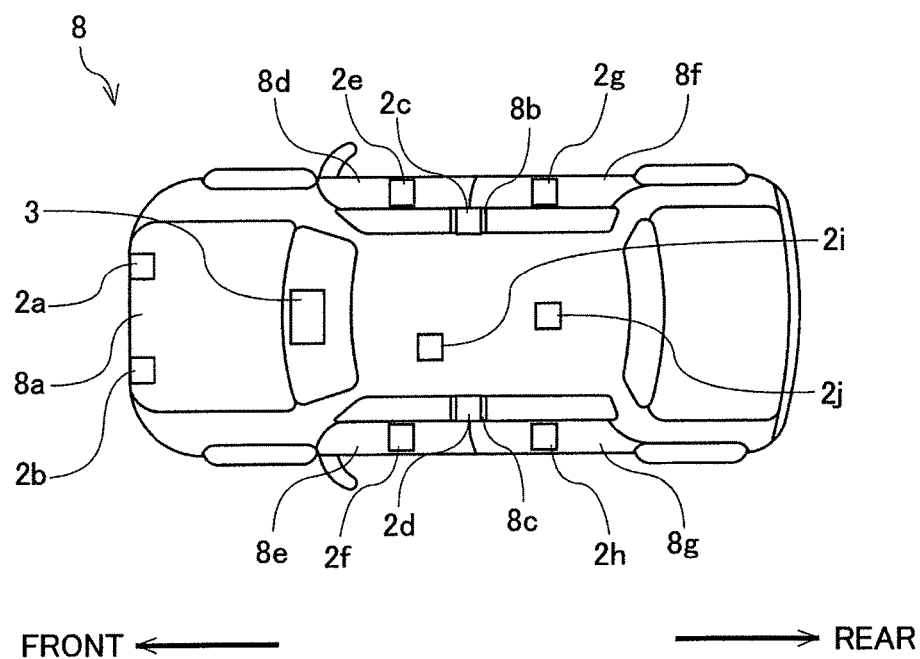
FIG. 1 is a schematic plan view of a vehicle mounted with a vehicle collision detection apparatus according to a first embodiment of the present disclosure.

Referring to FIGS. 1 to 7B, impact sensors 2a, 2b, 2c, 2d, 2e, 2f, 2g, and 2h and a vehicle collision detection apparatus 1 according to the present disclosure will be described. As shown in FIG. 1, a vehicle 8 includes a right front impact sensor 2a, a left front impact sensor 2b, a right pillar impact sensor 2c, a left pillar impact sensor 2d, a right front door impact sensor 2e, a left front door impact sensor 2f, a right rear door impact sensor 2g, a left rear door impact sensor 2h, a safing sensor 2i and safing sensor 2j. These sensors may hereinafter be referred to collectively as impact sensors 2 (each corresponding to the sensor device).

The right front impact sensor 2a and left front impact sensor 2b are respectively mounted on the left and right sides of a front portion 8a of the vehicle 8. The right pillar impact sensor 2c is mounted in a right center pillar (B pillar) 8b located between the front and rear seats of the vehicle 8. The left pillar impact sensor 2d is mounted in a left center pillar 8c. The right front door impact sensor 2e and left front door impact sensor 2f are mounted in a right front door 8d and a left front door 8e of the vehicle, respectively. The right rear door impact sensor 2g and left rear door impact sensor 2h are mounted in a right rear door 8f and a left rear door 8g of the vehicle 8, respectively. The safing sensors 2i and 2j are for providing shock detection redundancy and are located below a front passenger's seat and a rear passenger's seat, neither shown, respectively.

It is not always necessary that the impact sensors 2 include all the above-mentioned sensors, that is, the sensors included in the impact sensors 2 may account for only some of the above-mentioned sensors. The impact sensors 2 may include other sensors not included in the above-mentioned sensors.

The above-mentioned impact sensors 2 may be either acceleration sensors or pressure sensors. In cases where the impact sensors 2 are acceleration sensors, the acceleration sensors may be electrostatic capacitance type acceleration sensors or piezoresistive acceleration sensors or heat detection type acceleration sensors. In cases where the impact sensors 2 are pressure sensors, the pressure sensors may be semiconductor pressure sensors or sensors using a strain gauge.

Each impact sensor 2 detects an impact generated in the vehicle 8 at the time of a collision by detecting an acceleration or a pressure change.

Figure 2:
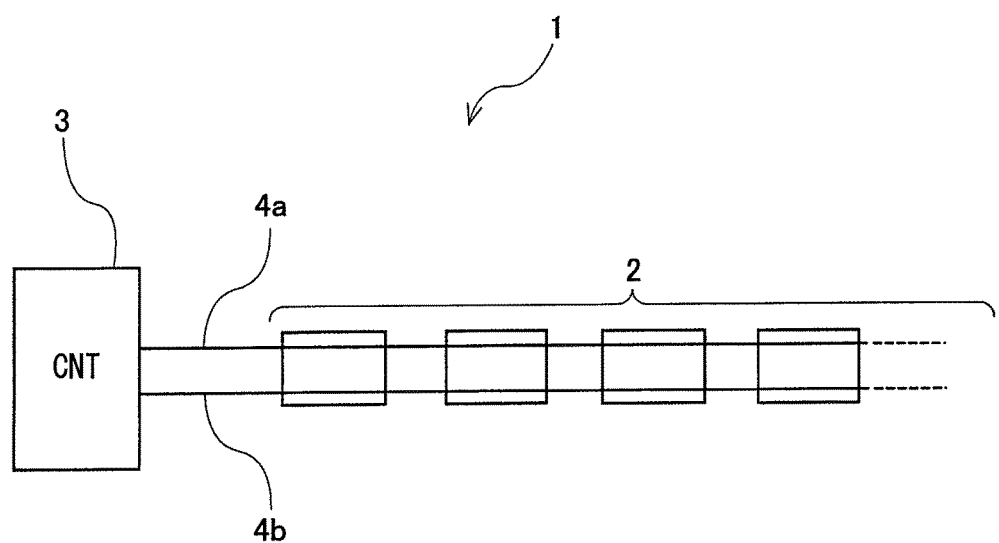
FIG. 2 is a schematic configuration diagram of the vehicle collision detection apparatus.

In the vehicle 8, a controller 3 is mounted on a lower side of the dashboard in front of the driver's seat. The controller (CNT) 3 is a control device including, for example, an I/O device, a CPU and a RAM, none shown. As shown in FIG. 2, the controller 3 is connected with the respective impact sensors 2 using a positive-side line 4a (corresponding to the first line) and a negative-side line 4b (corresponding to the second line). Though, in FIGS. 2 and 3, the positive-side line 4a and negative-side line 4b are illustrated as being parallel to each other, they are twisted around each other forming a twisted-pair cable. As shown in FIG. 2, a plurality of impact sensors 2 are serially connected to the controller 3 forming a so-called daisy chain connection. In this way, the number of input terminals the controller 3 is required to have for communication purposes is reduced. In the present embodiment, the controller 3 determines a collision of the vehicle 8 based on a value detected by the impact sensors 2 and actuates a passenger protection device (not shown), for example, an airbag device or a belt pretensioner.

Figure 3:
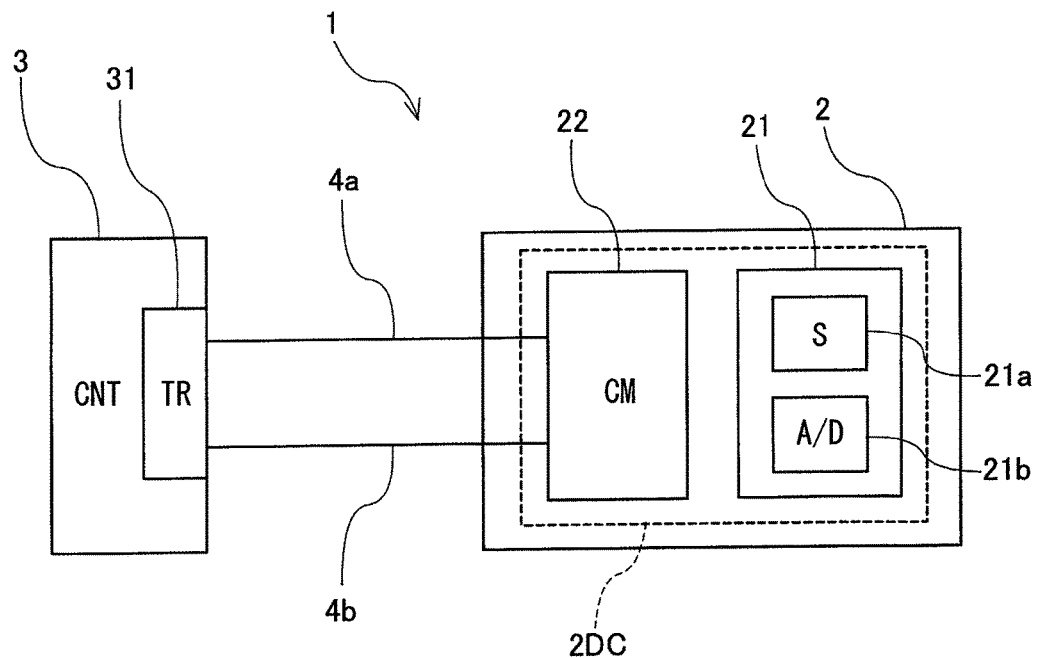
FIG. 3 is a block diagram showing an impact sensor and a controller connected to each other.
Figure 5:
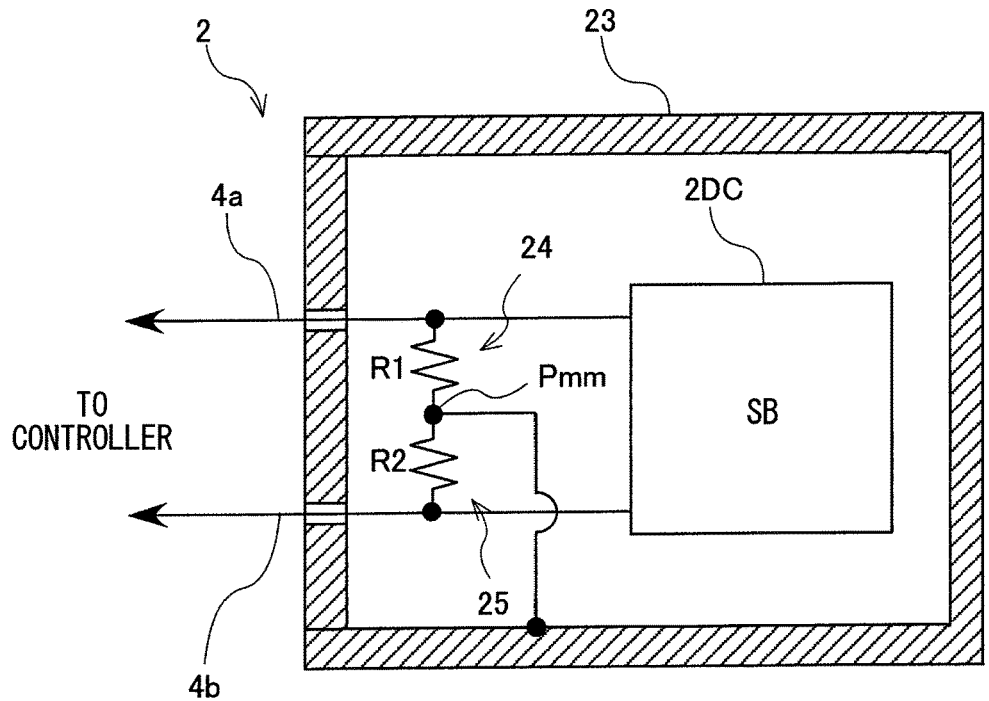
FIG. 5 is a schematic diagram showing the structure of the impact sensor.

In FIGS. 3 and 5 being described in the following, only a single impact sensor 2 is illustrated as a representative of all impact sensors 2 and the sensor structure illustrated in FIGS. 3 and 5 is common to all the impact sensors 2. As shown in FIG. 3, the impact sensor 2 includes a detection unit 21 (corresponding to the detection device) which detects an acceleration or a pressure (corresponding to one of the predetermined physical quantities) generated in the vehicle 8 and converts the detected acceleration or pressure into a detection signal. The detection unit 21 includes a sensor element (S) 21a and an A/D converter (ND) 21b. The A/D converter 21b is connected to a communication unit (CM) 22 (corresponding to the communication device). The communication unit 22 of the impact sensor 2 is connected to a transmitting/receiving device (TR) 31 formed in the controller 3 through the positive-side line 4a and the negative-side line 4b. The structure embracing the detection unit 21 and the communication unit 22 of the impact sensor 2 is referred to as a sensor body 2DC.

The transmitting/receiving device 31 of the controller 3 is formed of an IC and controls transmission/reception between the controller 3 and the impact sensor 2. The transmitting/receiving device 31 transmits a request signal to the communication unit 22 of the impact sensor 2. The request signal is formed of a positive-side signal VPS (corresponding to the signal on the first line) transmitted onto the positive-side line 4a and a negative-side signal VNS (corresponding to the signal on the second line) transmitted onto the negative-side line 4b (see FIG. 4). The transmission of a request signal from the controller 3 to the impact sensor 2 is carried out by a differential transmission method (differential communication) based on the difference between the positive-side signal VPS and the negative-side signal VNS. The positive-side signal VPS and the negative-side signal VNS respectively have waveforms symmetrical to each other in the vertical axis (voltage) direction.

Figure 4:
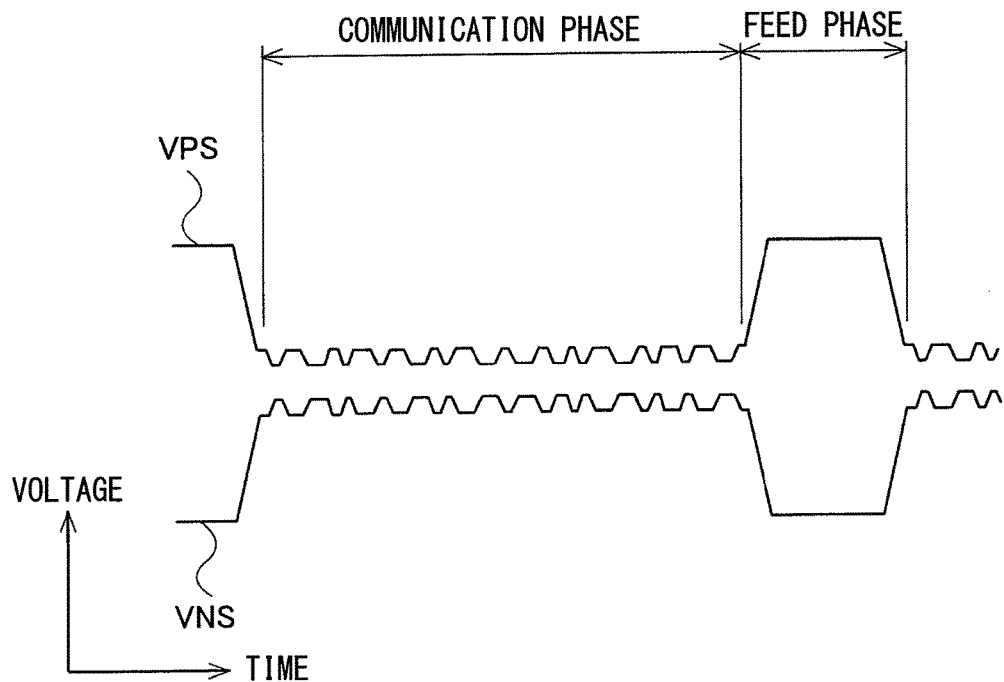
FIG. 4 is a diagram showing a positive-side signal and a negative-side signal making up a request signal transmitted from the controller to the impact sensor.

Referring to the positive-side signal VPS and the negative-side signal VNS shown in FIG. 4, the communication phase represents a state of information transmission from the controller 3 to the impact sensor 2. In the communication phase, the voltage values of the positive-side signal VPS and the negative-side signal VNS are at either H or L level for the purpose of information transmission. The feed phase of the positive-side signal VPS and the negative-side signal VNS represents a state of feeding power from the controller 3 to the impact sensor 2 for use in information transmission from the impact sensor 2 to the controller 3. The impact sensor 2 stores the power supplied from the controller 3 in a capacitor, not shown, and uses the stored power when transmitting information to the controller 3.

Upon receiving a request signal from the controller 3, the impact sensor 2 digitizes the signal detected by the sensor element 21a using the A/D converter 21b, then transmits the digitized signal from the communication unit 22 to the transmitting/receiving device 31 of the controller 3. The transmission from the communication unit 22 is made between request signal receptions from the controller 3. In the present embodiment, information is transmitted from the impact sensor 2 to the controller 3 using a single signal representing the information using a current value. Alternatively, both the transmission from the controller 3 to the impact sensor 2 and the transmission from the impact sensor 2 to the controller 3 may be carried out by a differential transmission method or only the transmission from the impact sensor 2 to the controller 3 may be carried out by a differential transmission method.

As shown in FIG. 5, the impact sensor 2 includes a shield member 23 (corresponding to the conductive shield member) covering the sensor body 2DC (including the detection unit 21 and the communication unit 22 and denoted as "SB" in FIG. 5). The shield member 23 is formed of a synthetic resin material such as polybutylene terephthalate, nylon or polyphenylene sulfide which is used as a base material and is added to by a metallic conductive filler or a conductive filler formed of a glass filler coated with a metallic material. The shield member 23 containing the conductive filler is conductive and shields internally generated radiation noise.

The positive-side line 4a is connected with one end of an upper resistor 24 (corresponding to the first resistor) having a predetermined resistance value R1. A lower resistor 25 (corresponding to the second resistor) connects the other end of the upper resistor 24 and the negative-side line 4b. In the present embodiment, the lower resistor 25 has a resistance value R2 equal to the resistance value R1 of the upper resistor 24 (R1=R2). The shield member 23 is connected to a midpoint Pmm where the upper resistor 24 and the lower resistor 25 are connected. Though, in FIG. 5, the upper resistor 24 and the lower resistor 25 are disposed in the shield member 23, the resistors may be disposed outside the shield member 23.

Figure 6:
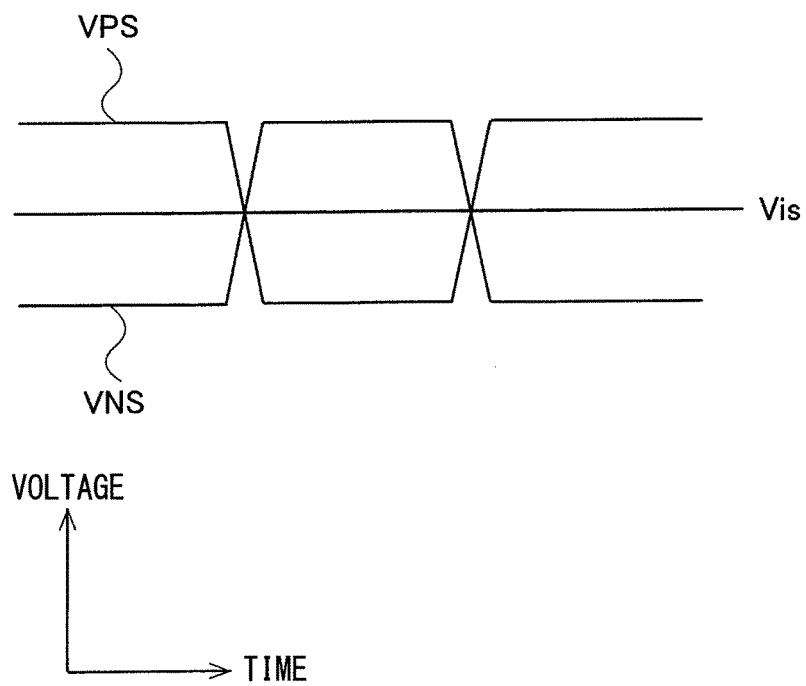
FIG. 6 is a diagram showing the potential relationship between the request signal shown in FIG. 4 and a shield member.

As described above, in the impact sensor 2, the upper resistor 24 and the lower resistor 25 having equal resistance values are connected to the positive-side line 4a and the negative-side line 4b, respectively, and the shield member 23 is connected to the midpoint Pmm where the upper resistor 24 and the lower resistor 25 are connected. The waveforms of the positive-side signal VPS and the negative-side signal VNS that are transmitted through the positive-side line 4a and the negative-side line 4b, respectively, are symmetrical to each other in the voltage direction. In this arrangement, as shown in FIG. 6, the potential Vis of the shield member 23 is always kept at an intermediate potential between the positive-side signal VPS and the negative-side signal VNS to be constant regardless of variations of the positive-side signal VPS and the negative-side signal VNS. The intermediate potential refers to a mid-value between the voltage of the positive-side signal VPS and the voltage of the negative-side signal VNS.

According to the present embodiment, the impact sensor 2 has the shield member 23 covering the detection unit 21 and the communication unit 22 and the shield member 23 is applied with a constant potential. In this arrangement, even when the positive-side signal VPS and the negative-side signal VNS transmitted through the positive-side line 4a and the negative-side line 4b, respectively, by a differential transmission method develop voltage variations, noise generated in the shield member 23 can be prevented from being radiated out of the shield member 23 with the potential of the shield member 23 kept constant.

Figure 7A:
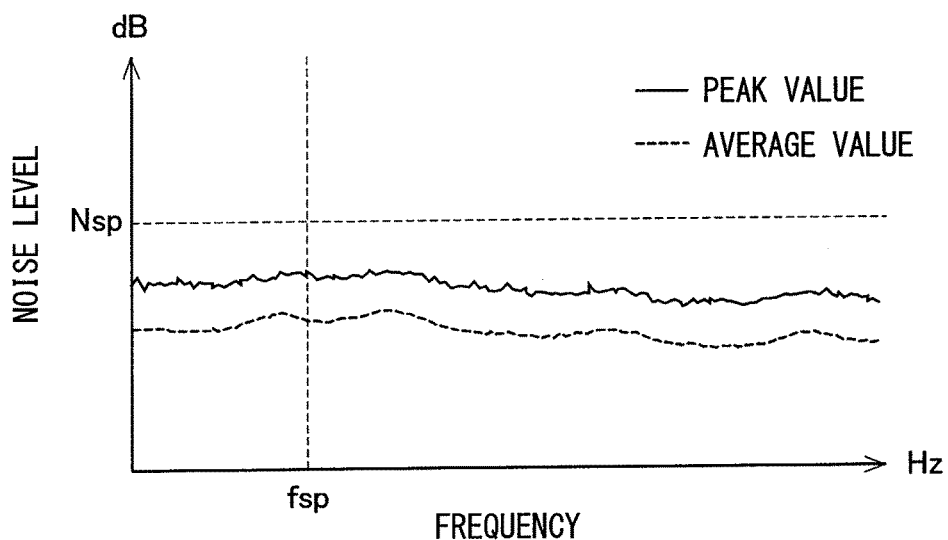
FIG. 7A is a graph showing a noise characteristic of the impact sensor according to the present embodiment.
Figure 7B:
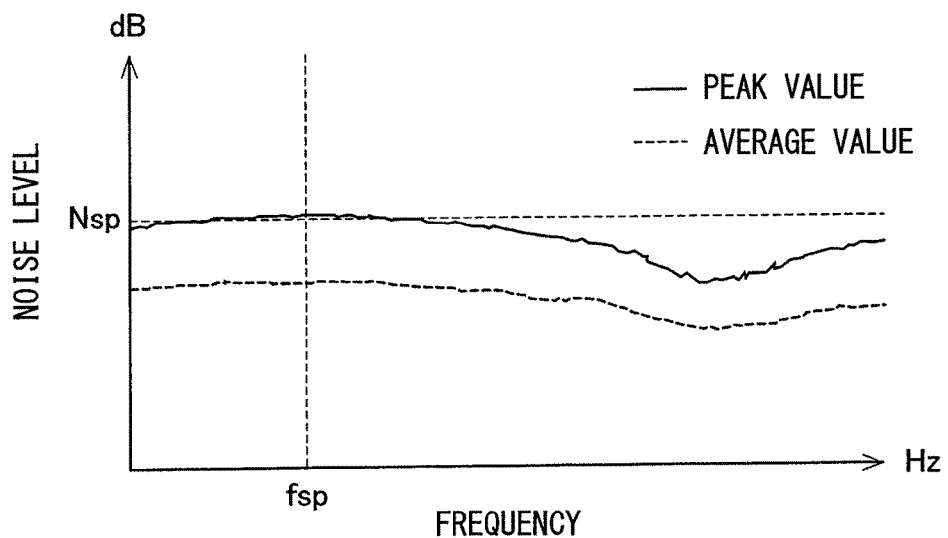
FIG. 7B is a graph showing a noise characteristic of an impact sensor as a comparative example to the first embodiment.

As shown in FIG. 7A, the radiation noise level measured on the impact sensor 2 of the present embodiment is remarkably lower than in the case shown in FIG. 7B with the shield member 23 connected to the negative-side line 4b. In each of FIGS. 7A and 7B, the peak value curve has been drawn by interconnecting radiation noise peak points and the average value curve has been drawn by interconnecting radiation noise average value points.

As stated in the foregoing, a method in which a shield member is connected to ground for radiation noise reduction has been known (e.g. disclosed in JP 5157967 B2. In the impact sensor 2 of the present embodiment, the potentials of both the positive-side signal VPS and the negative-side signal VNS on the positive-side line 4a and the negative-side line 4b, respectively, vary. Therefore, even when the shield member 23 is connected to the positive-side line 4a or the negative-side line 4b, the potential of the shield member 23 itself varies to increase radiation noise.

In the case of the above-described impact sensor 2, on the other hand, the shield member 23 is applied with a constant potential. Even in the impact sensor 2 to carry out differential transmission, noise radiation to outside the shield member 23 can be reduced.

The shield member 23 is only applied with a constant potential and no ground pattern is required. Hence, a printed board is not required and the impact sensor 2 can be made small and light with a simple structure.

According to the present disclosure, applying a constant potential to the shield member 23 embraces applying, to the shield member 23, a potential which practically slightly fluctuates in a range where the effect of reducing the radiation noise from the impact sensor 2 is maintained.

The positive-side signal VPS and the negative-side signal VNS have respective waveforms which are symmetrical with each other in the voltage direction and the shield member 23 is applied with an intermediate potential between the potentials of the positive-side signal VPS transmitted through the positive-side line 4a and the negative-side signal VNS transmitted through the negative-side line 4b. This makes it easy to apply a constant potential to the shield member 23.

According to the present disclosure, applying an intermediate potential between the potentials of the positive-side signal VPS and the negative-side signal VNS to the shield member 23 embraces applying, to the shield member 23, a potential which practically slightly fluctuates from the mid-value between the potentials of the positive-side signal VPS and the negative-side signal VNS in a range where the effect of reducing the radiation noise from the impact sensor 2 is maintained.

The impact sensor 2 includes the upper resistor 24 having a predetermined resistance value R1 and connected at one end to the positive-side line 4a and the lower resistor 25 having a resistance value R2 which is equal to the resistance value R1 of the upper resistor 24 and connecting the other end of the upper resistor 24 and the negative-side line 4b, and the shield member 23 is connected to mid-point Pmm where the upper resistor 24 and the lower resistor 25 are connected. This makes it easy to apply a constant intermediate potential to the shield member 23.

According to the present disclosure, making the resistance value R1 of the upper resistor 24 equal to the resistance value R2 of the lower resistor 25 embraces cases in which there is a slight practical difference between the resistance value R1 and the resistance value R2 in a range where the effect of reducing the radiation noise from the impact sensor 2 is maintained.

The vehicle collision detection apparatus 1 according to the present embodiment includes: the impact sensor 2 that is applied with an intermediate potential between the positive-side signal VPS and the negative-side signal VNS and detects an impact generated in the vehicle 8; the controller 3 that is connected to the impact sensor 2 and, based on a value detected by the impact sensor 2, determines a collision of the vehicle 8; and the positive-side line 4a and negative-side line 4b that connect the impact sensor 2 and the controller 3 and are used for transmission from the controller 3 to the impact sensor 2 by a differential transfer method. Therefore, even when the voltages of the positive-side signal VPS and negative-side signal VNS transmitted through the positive-side line 4a and negative-side line 4b by a differential transmission method vary, the potential of the shield member 23 is kept constant, so that outward noise radiation from inside the shield member 23 can be suppressed. Therefore, audio equipment, control devices and the like of the vehicle 8 are not affected and passengers are not caused to feel unpleasant. This facilitates safe traveling of the vehicle 8.

Second Embodiment

Figure 8A:
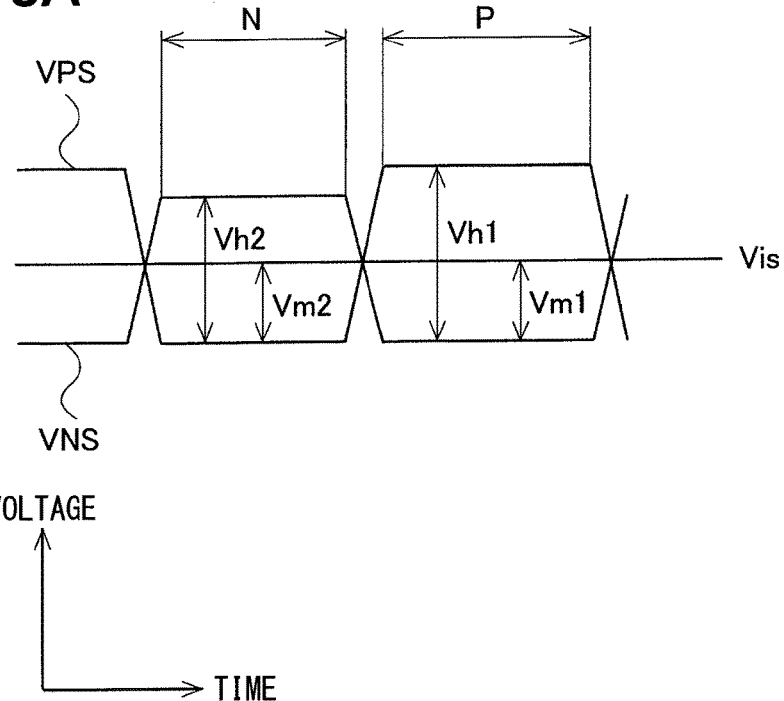
FIG. 8A is a diagram showing the potential relationship between a request signal and a shield member according to a second embodiment.

Based on FIGS. 8A and 8B, the impact sensor 2 of a second embodiment will be described focusing on differences from the first embodiment. The impact sensor 2 of the present embodiment is also structured as shown in FIG. 5. As shown in FIG. 8A, in the present embodiment, the waveforms of the positive-side signal VPS and the negative-side signal VNS have portions where the waveforms are not symmetrical to each other, for example, due to waveform skewing. In the present embodiment, the voltage amplitude Vh2 of the negative-side signal VNS is smaller than the voltage amplitude Vh1 of the positive-side signal VPS (Vh1>Vh2).

As shown in FIG. 8A, assume that, in the present embodiment, too, the shield member 23 is applied with a constant potential Vis regardless of variations of the positive-side signal VPS and the negative-side signal VNS. Also assume that, during period P with the positive-side signal VPS at H level, the potential difference between potential Vis of the shield member 23 and the potential of the negative-side signal VNS at L level is Vm1 and that, during period N with the negative-side signal VNS at H level, the potential difference between potential Vis of the shield member 23 and the potential of the positive-side signal VPS at L level is Vm2. Since the potential Vis of the shield member 23 is always constant, the potential differences Vm1 and Vm2 are assumed to be equal (Vm1=Vm2). The potential Vis of the shield member 23 is, like in the first embodiment, a result of voltage division by the upper resistor 24 and the lower resistor 25, so that, in the period P, equation, Vm1=(R2/(R1+R2))Vh1, holds and so that, in the period N, equation, Vm2=(R1/(R1+R2))Vh2, holds. This establishes equation, (R2/(R1+R2))Vh1=(R1/(R1+R2))Vh2. Solving this equation with respect to R1 and R2 establishes equation, R1/R2=Vh1/Vh2. Namely, it is known that, when the waveforms of the positive-side signal VPS and the negative-side signal VNS are not symmetrical to each other, keeping the potential Vis applied to the shield member 23 constant regardless of variations of the positive-side signal VPS and the negative-side signal VNS requires the ratio of the resistance value R1 of the upper resistor 24 to the resistance value R2 of the lower resistor 25 to be equal to the ratio of the voltage of the positive-side signal VPS on the positive-side line 4a to the voltage of the negative-side signal VNS on the negative-side line 4b.

The above description is based on the assumption that the voltage amplitude Vh2 of the negative-side signal VNS is smaller than the voltage amplitude Vh1 of the positive-side signal VPS, but the resistance value R1 of the upper resistor 24 and the resistance value R2 of the lower resistor 25 can be set in the same manner also in cases where the voltage amplitude Vh1 of the positive-side signal VPS is smaller than the voltage amplitude Vh2 of the negative-side signal VNS.

The asymmetry between the positive-side signal VPS and the negative-side signal VNS is attributable to factors in manufacture of the controller 3. Therefore, inspecting a plurality of controllers 3 after manufacture to measure asymmetry between the positive-side signal VPS and the negative-side signal VNS will facilitate setting the resistance value R1 of the upper resistor 24 and the resistance value R2 of the lower resistor 25.

Figure 8B:
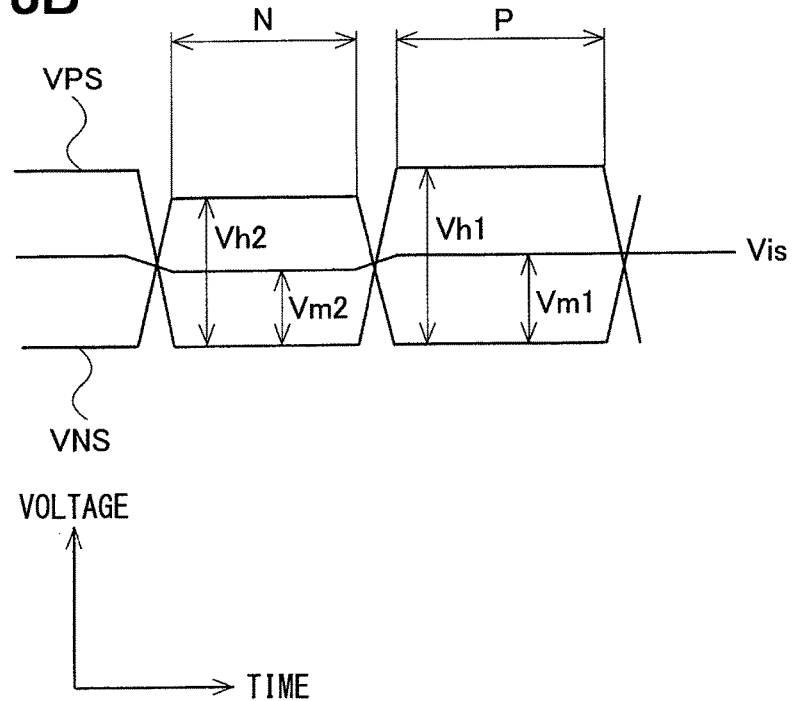
FIG. 8B is a diagram showing the potential relationship between a request signal and a shield member as a comparative example to the second embodiment.

In cases where, as in the first embodiment, the resistance values R1 and R2 of the upper resistor 24 and lower resistor 25 are made to be equal to each other and, as shown in FIG. 8B, an intermediate potential between the positive-side signal VPS and the negative-side signal VNS is applied to the shield member 23 ((Vh1/2)=Vm1 during period P and (Vh2/2)=Vm2 during period N), the potential Vis applied to the shield member 23 varies with variations of the positive-side signal VPS and the negative-side signal VNS.

According to the present embodiment, the impact sensor 2 includes the upper resistor 24 having a predetermined resistance value R1 and connected, at one end thereof, to the positive-side line 4a and the lower resistor 25 having a predetermined resistance value R2 and connecting the other end of the upper resistor 24 and the negative-side line 4b, and the shield member 23 is connected to mid-point Pmm where the upper resistor 24 and the lower resistor 25 are connected. Concerning the request signal received by a differential transmission method, when the positive-side signal VPS on the positive-side line 4a and the negative-side signal VNS on the negative-side line 4b are not symmetrical to each other, the ratio of the resistance value R1 of the upper resistor 24 to the resistance value R2 of the lower resistor 25 is made to be equal to the ratio of the voltage of the positive-side signal VPS to the voltage of the negative-side signal VNS. In this way, even when the positive-side signal VPS and the negative-side signal VNS are not symmetrical to each other, a constant voltage Vis can be applied to the shield member 23, so that the radiation noise shielding efficiency of the impact sensor 2 can be improved.

Since the radiation noise from the impact sensor 2 can be reduced even in cases where the positive-side signal VPS and the negative-side signal VNS are not symmetrical to each other, it is not necessary to provide the controller 3 with a circuit for symmetrizing the positive-side signal VPS and the negative-side signal VNS.

According to the present disclosure, setting the resistor values R1 and R2 of the upper resistor 24 and lower resistor 25 such that the ratio of the resistance value R1 of the upper resistor 24 to the resistance value R2 of the lower resistor 25 is equal to the ratio of the voltage of the positive-side signal VPS on the positive-side line 4a to the voltage of the negative-side signal VNS on the negative-side line 4b embraces cases in which there is a slight practical difference between the two ratios in a range where the effect of reducing the radiation noise from the impact sensor 2 is maintained.

Other Embodiments

The present disclosure is not limited to the above embodiments and can be modified or expanded as follows.

The present disclosure can be applied not only to acceleration sensors and pressure sensors but also to all types of sensor devices such as speed sensors, displacement sensors, yaw rate sensors, flow rate sensors and temperature sensors.

The present disclosure can also be applied to sensors mounted in devices other than vehicles, for example, industrial machines and household electrical appliances.

It is understood that the present disclosure has been described in accordance with the embodiments, but the present disclosure is not limited to the embodiments and the structures thereof. The present disclosure also encompasses variations in the equivalent range as various modifications. In addition, various combinations and embodiments, and further, only one element thereof, less or more, and the form and other combinations including, are intended to fall within the spirit and scope of the present disclosure.

The invention claimed is:

1. A sensor device comprising:
a detection device configured to detect a predetermined physical quantity and converts the physical quantity into a detection signal;
a communication device configured to be connected to a controller through a first line and a second line, perform at least one of reception from the controller or transmission to the controller by a differential transmission method and, based on a request signal received from the controller, transmit the detection signal generated by the detection device; and
a conductive shield member configured to cover the detection device and the communication device such that the detection device and the communication device are disposed inside of the conductive shield member, wherein
the conductive shield member is applied with a constant potential such that the conductive shield member is configured to provide a shield that suppresses transmission of outward noise radiation through the conductive shield member, wherein the conductive shield member is applied with an intermediate potential between the first line and the second line.

2. The sensor device according to claim 1, further comprising:
a first resistor having a predetermined resistance value, one end of the first resistor being connected to the first line; and
a second resistor having the same resistance value as the resistance value of the first resistor and connecting the other end of the first resistor and the second line, wherein
the conductive shield member is connected to a connection point between the first resistor and the second resistor.

3. The sensor device according to claim 1, further comprising:
a first resistor having a predetermined resistance value, one end of the first resistor being connected to the first line; and
a second resistor having a predetermined resistance value and connecting the other end of the first resistor and the second line, wherein
the conductive shield member is connected to a connection point between the first resistor and the second resistor, and
in the request signal received by a differential transmission method or the detection signal transmitted by a differential transmission method, when a signal on the first line and a signal on the second line are not symmetrical to each other, a ratio of the resistance value of the first resistor to the resistance value of the second resistor is equal to a ratio of the voltage of the first line to the voltage of the second line.

4. A vehicle collision detection apparatus comprising:
an impact sensor configured to detect an impact generated in a vehicle, the impact sensor being the sensor device according to claim 1;
an impact sensor configured to detect an impact generated in a vehicle;
a controller configured to be connected to the impact sensor and, based on a value detected by the impact sensor, determines a collision of the vehicle; and
a first line and a second line configured to connect the impact sensor and the controller, and conduct, by a differential transmission method, at least one of transmission from the controller to the impact sensor and transmission from the impact sensor to the controller.

5. The sensor device according to claim 1, wherein the outward noise radiation is generated by and radiates outward from at least one of the detection device and the communication device.

* * * * *